(12) United States Patent
Matteson et al.

(10) Patent No.: US 6,269,001 B1
(45) Date of Patent: Jul. 31, 2001

(54) SYSTEM FOR ENHANCED COOLING AND LATCHING OF PLUGGABLE ELECTRONIC COMPONENT

(75) Inventors: Jason Aaron Matteson; Eric Thomas Gamble; Karl Klaus Dittus, all of Raleigh; Brian Alan Trumbo, Apex, all of NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/553,185

(22) Filed: Apr. 20, 2000

(51) Int. Cl.[7] ..................................................... H05K 7/20
(52) U.S. Cl. ..................... 361/695; 165/80.3; 248/510; 361/719
(58) Field of Search ........................... 454/184; 312/236; 165/80.3, 121–126; 361/687, 690, 694, 695, 697, 759, 717–719, 754, 756; 416/223 R; 415/178, 213.1, 214.1; 248/505, 510

(56) References Cited

U.S. PATENT DOCUMENTS

| | | | |
|---|---|---|---|
| 5,835,347 | * | 11/1998 | Chu . |
| 5,841,633 | * | 11/1998 | Huang . |
| 5,854,738 | * | 12/1998 | Bowler . |
| 5,966,289 | * | 10/1999 | Hastings . |
| 5,973,921 | * | 10/1999 | Lin . |
| 6,084,774 | * | 7/2000 | Talbot . |
| 6,115,250 | * | 9/2000 | Schmitt . |
| 6,116,566 | * | 9/2000 | Brown . |
| 6,155,433 | * | 12/2000 | Anderson . |

* cited by examiner

Primary Examiner—Gerald Tolin
(74) Attorney, Agent, or Firm—Bracewell & Patterson, LLP

(57) ABSTRACT

An integrated cooling and retention bracket is detachably coupled to a computer processor cartridge having a heatsink mounted thereto. The bracket is U-shaped with a cross-bar and a short, perpendicular arm on each end of the cross-bar. The lower end of each arm acts as a hinge for an upward-turned extension on the outer side of each arm. Each extension has a rounded knob at its tip and an outward protruding tooth therebelow. An integrally formed, cooling fan mounting structure is located on top of the cross-bar. The mounting structure has two side panels with a central opening therebetween for holding a conventional cooling fan, which is snap mounted inside the central opening. The cartridge and bracket assembly is installed in a retention mechanism on a printed circuit board. The teeth on the bracket snap into holes in the posts in the retention mechanism to electrically interconnect the processor cartridge to the circuit board. With the assembly installed in the retention mechanism, the fan is located directly adjacent to the cartridge for cooling the processor. The concave surfaces of the end wall and the baffle direct airflow from the fan along the entire width heatsink to maximize the cooling capability of the fan.

7 Claims, 9 Drawing Sheets

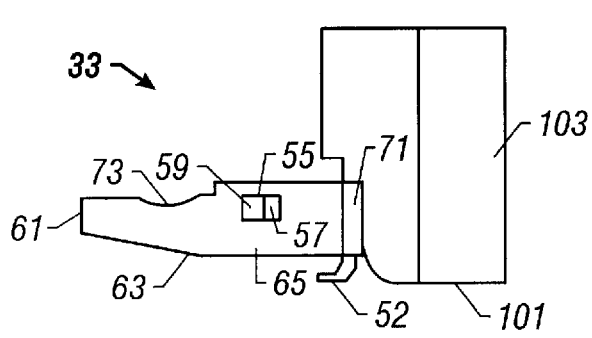
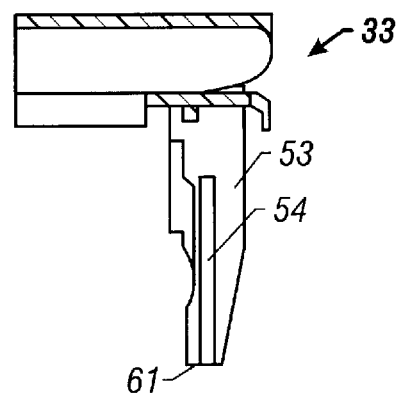
FIG. 14      FIG. 15
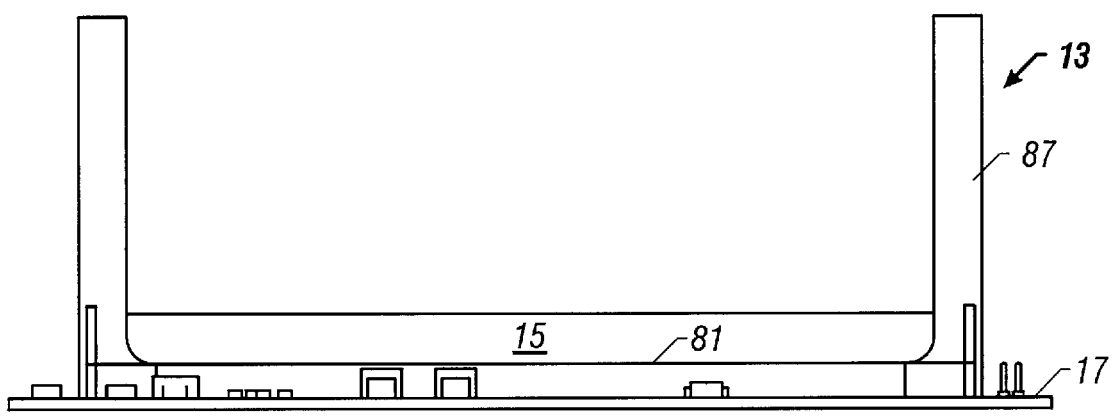
FIG. 16
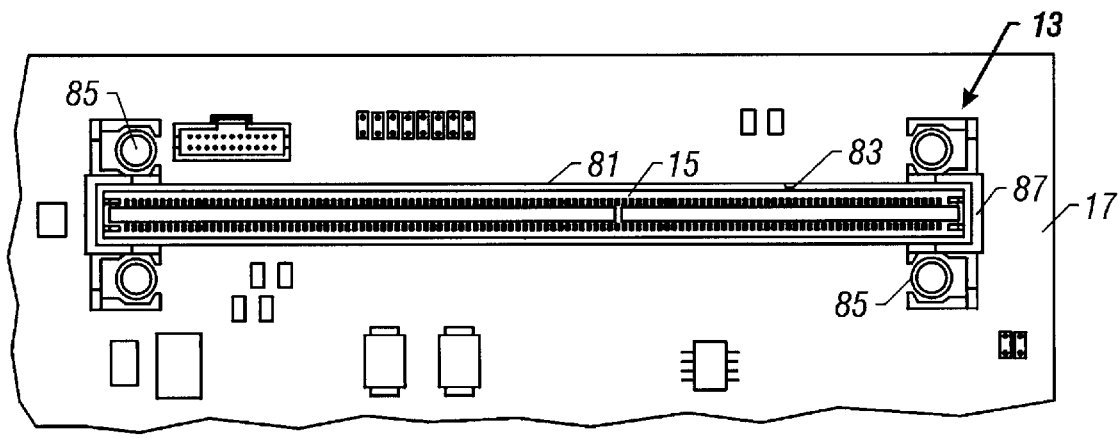
FIG. 17

SYSTEM FOR ENHANCED COOLING AND LATCHING OF PLUGGABLE ELECTRONIC COMPONENT

BACKGROUND OF THE INVENTION

1. Technical Field

This invention relates in general to the integrated cooling and handling of pluggable electronic components, and in particular to the improved cooling and latching of a pluggable processor cartridge. Still more particularly, the invention relates to an improved system for enhancing the cooling and rapid release/retention of a pluggable processor cartridge.

2. Description of the Prior Art

In computer equipment, the need to upgrade and/or replace electrical components is more prevalent than ever. Many different solutions for installing new components or removing existing components are known in the prior art. However, not all devices or methods allow technicians to perform the work efficiently and reliably. This is particularly true for components that require fasteners such as screws for mounting purposes, or those that require latching or retention mechanisms for enhanced retention capability. Moreover, some new components are not compatible with the existing retention mechanisms that were used with the previous components that they are replacing.

This problem is exacerbated by the enhanced cooling needs of today's high speed computer processors. Processor manufacturers now require computer manufacturing companies to accommodate lower junction temperatures while allowing for greater power dissipation. These requirements demand enhanced thermal design solutions. To maintain adequate heat sink efficiencies, some cooling systems need to incorporate aggressive "passive" and/or "active" cooling solutions. Passive heat sinks allow airflow generated external to the heat sink to pass over the heat sink to permit redundant cooling. Some computer systems that do not require cooling redundancy may require more active heat sink cooling. These advanced thermal design solutions are very difficult if not impossible to incorporate into current retention mechanism designs. Thus, a need exists for an improved system for reliably installing and removing an electrical component, such as a processor, with a retention mechanism that is capable of incorporating an enhanced cooling system.

SUMMARY OF THE INVENTION

An integrated cooling and retention bracket is detachably coupled to a computer processor cartridge having a heatsink mounted thereto. The bracket is U-shaped with a cross-bar and a short, perpendicular arm on each end of the cross-bar. The lower end of each arm acts as a hinge for an upward-turned extension on the outer side of each arm. Each extension has a rounded knob at its tip and an outward protruding tooth therebelow. An integrally formed, cooling fan mounting structure is located on top of the cross-bar. The mounting structure has two side panels with a central opening therebetween for holding a conventional cooling fan, which is snap mounted inside the central opening. A concave surfaced end wall and baffle are located between the fan and the processor cartridge on the bracket.

The cartridge and bracket assembly is installed in a retention mechanism on a printed circuit board. The teeth on the bracket snap into holes in the posts in the retention mechanism to electrically interconnect the processor cartridge to the circuit board. With the assembly installed in the retention mechanism, the fan is located directly adjacent to the cartridge for cooling the processor. The concave surfaces of the end wall and the baffle direct airflow from the fan along the entire width heatsink to maximize the cooling capability of the fan. The assembly is removed from the retention mechanism by pushing the knobs on the bracket inward and lifting the assembly out of the retention mechanism.

Accordingly, it is an object of the present invention to provide integrated cooling and handling of pluggable electronic components.

It is an additional object of the present invention to provide improved cooling and latching of a pluggable processor cartridge.

Still another object of the present invention is to provide an improved system for enhancing the cooling and rapid release/retention of a pluggable processor cartridge.

The foregoing and other objects and advantages of the present invention will be apparent to those skilled in the art, in view of the following detailed description of the preferred embodiment of the present invention, taken in conjunction with the appended claims and the accompanying drawings.

BRIEF DESCRIPTION OF THE DRAWINGS

So that the manner in which the features, advantages and objects of the invention, as well as others which will become apparent, are attained and can be understood in more detail, more particular description of the invention briefly summarized above may be had by reference to the embodiment thereof which is illustrated in the appended drawings, which drawings form a part of this specification. It is to be noted, however, that the drawings illustrate only a preferred embodiment of the invention and is therefore not to be considered limiting of its scope as the invention may admit to other equally effective embodiments.

FIG. 14 is an outer side view of the bracket of FIG. 1.

FIG. 15 is an inner side view of the bracket of FIG. 1.

FIG. 16 is a front view of the retention mechanism of FIG. 1.

FIG. 17 is a top view of the retention mechanism of FIG. 1.

DETAILED DESCRIPTION OF THE PREFERRED EMBODIMENT

Figure 1:
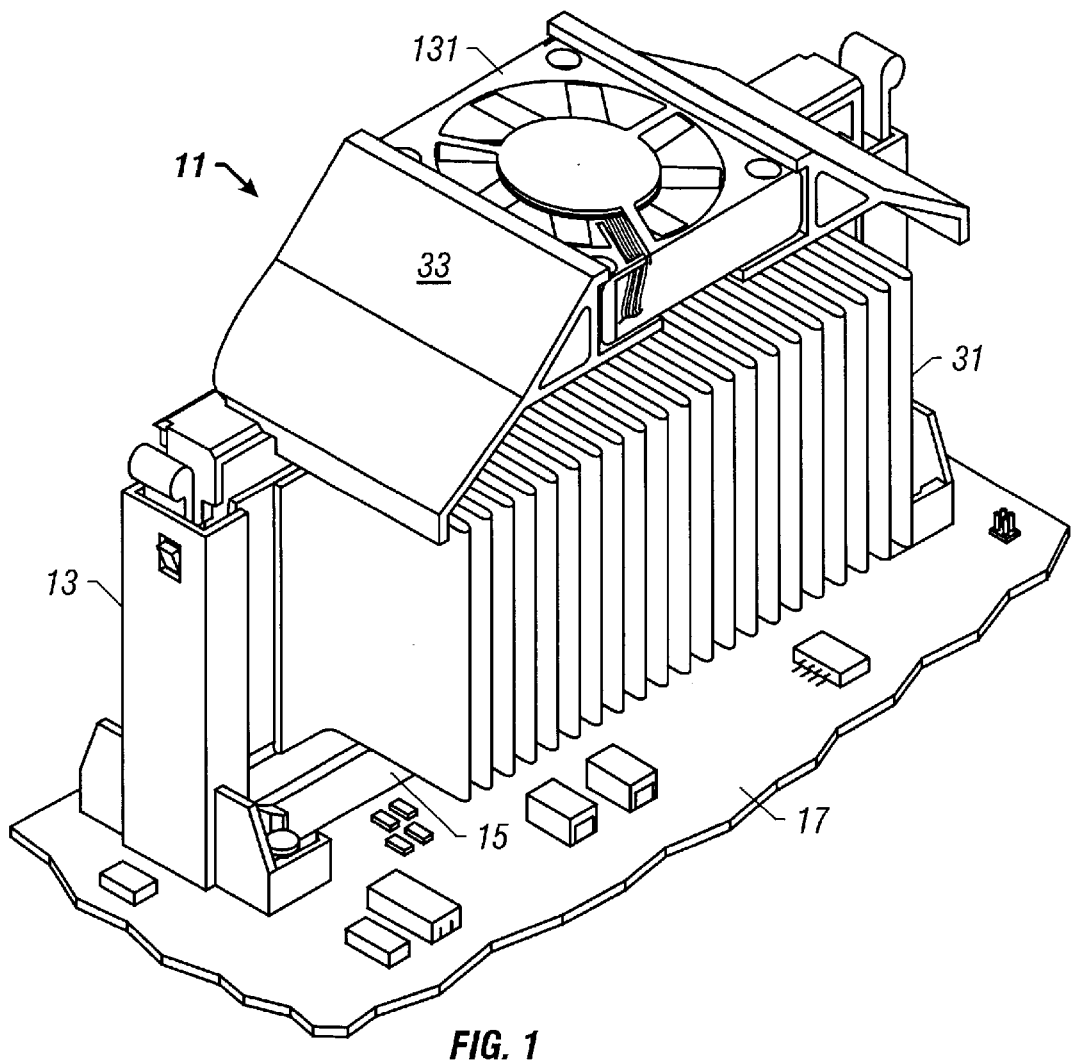
FIG. 1 is a front isometric view of a cartridge/bracket assembly installed in a retention mechanism and is constructed in accordance with the invention.
Figure 2:
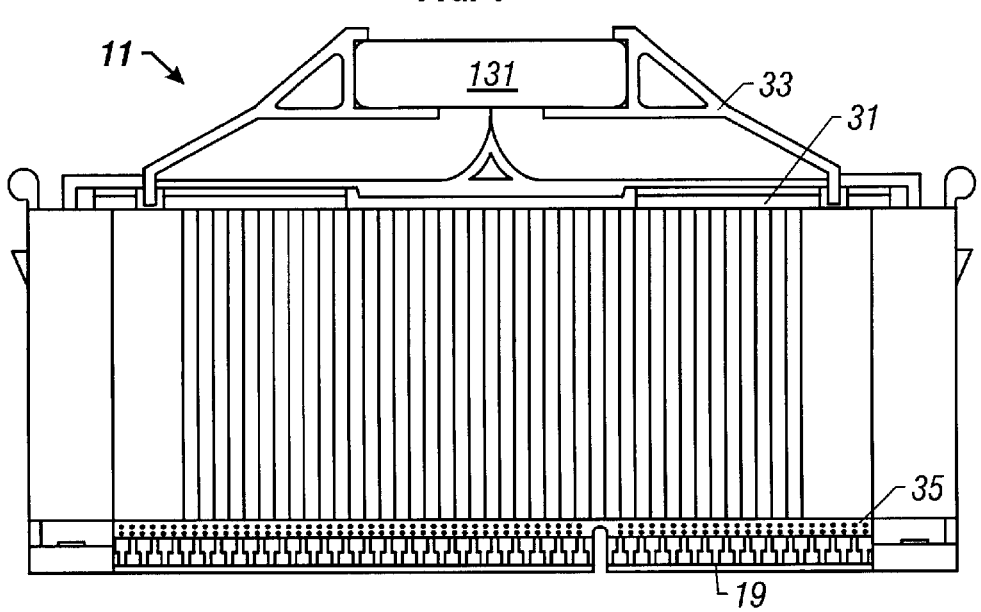
FIG. 2 is a front view of the cartridge/bracket assembly of FIG. 1.
Figure 3:
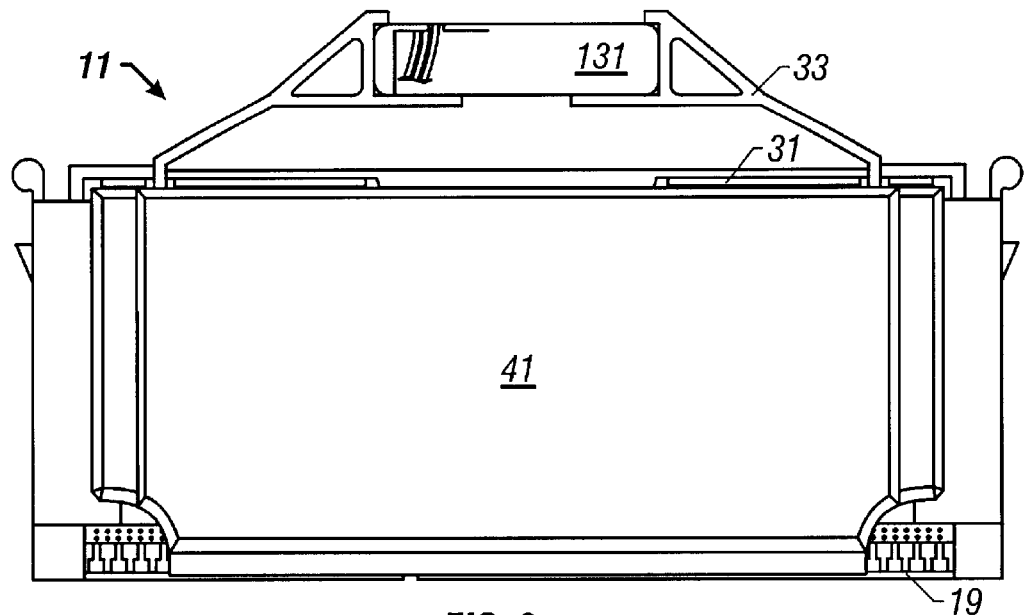
FIG. 3 is a rear view of the cartridge/bracket assembly of FIG. 1.
Figure 4:
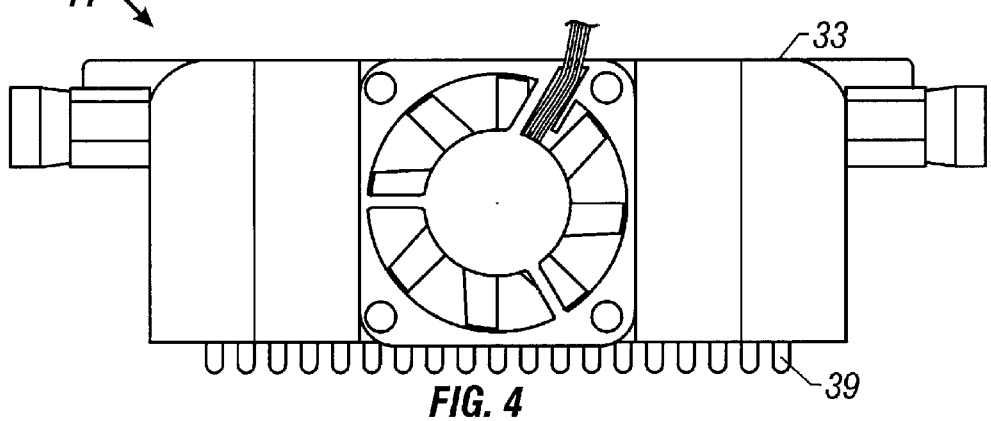
FIG. 4 is a top view of the cartridge/bracket assembly of FIG. 1.

Referring to FIG. 1, a cartridge/bracket assembly 11 is shown installed in a retention mechanism 13. Retention mechanism 13 is mounted adjacent to an elongated socket 15 (FIGS. 16–19) on a printed circuit board 17. Socket 15 is provided for receiving the connector edge 19 (FIG. 2) of assembly 11 and is electrically interconnected to board 17. Board 17 is a main system circuit board or motherboard for a computer (not shown) and has a large plurality of electrical components.

Figure 10:
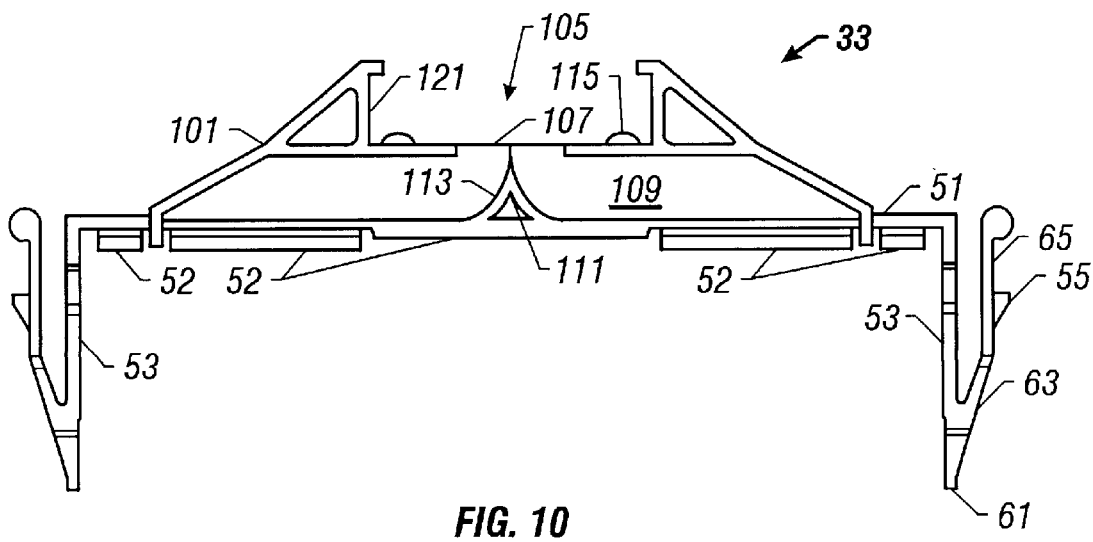
FIG. 10 is a front view of the bracket of FIG. 1.

As shown in FIGS. 2–5, assembly 11 comprises a processor cartridge 31 and flexible plastic bracket 33 that is generally U-shaped when viewed from the front (FIG. 10). Bracket 33 is detachably coupled to cartridge 31 as will be described below in further detail. Referring now to FIGS. 6–9, cartridge 31 comprises a small circuit board 35 with at least one microprocessor chip 37 (FIG. 9) and various other electrical components, a heatsink 39 mounted to chip 37, and a cover 41 mounted to board 35 opposite chip 37. The connector edge 19 forms the lower edge of board 35 which extends beneath chip 37. Heatsink 39 has a rectangular notch 43 in each of its lateral sides for engaging bracket 33 as will be described below. Cover 41 has a horizontally disposed tab 45 on the front side of its upper end.

FIGS. 10–15 illustrate the particular features of bracket 33. Bracket 33 includes a body having a flat, generally rectangular cross-bar 51 with several short stabilizing fingers 52. Fingers 52 are provided for releasably engaging the top of cartridge 31. A downward depending, flat arm 53 is located on each end of cross-bar 51. Arms 53 are substantially perpendicular to cross-bar 51. As shown in FIG. 15, each arm 53 has an elongated, rectangular slot 54 on its inner surface that extends along most of the length of arm 53. The lower end of each arm 53 terminates with a pointed edge 61. Edges 61 and their surrounding structure act as hinges between arms 53 and upward-turned extensions 63 on the outer sides of arms 53. There is a very small acute angle between each arm 53 and extension 63 combination, with the apex of the angles being defined at edges 61. Extensions 63 are about the same length as arms 53, and are generally tapered when viewed from the side with a flat outer surface 65 (FIG. 14).

Figure 11:
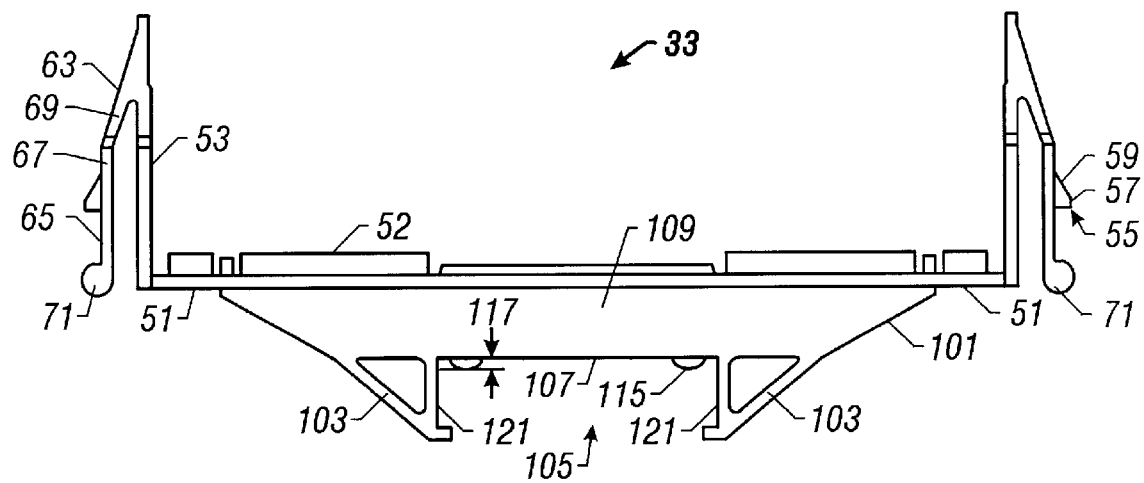
FIG. 11 is a rear view of one side of the bracket of FIG. 1.

As best shown in FIGS. 11 and 14, an outward protruding tooth 55 is located near the upper end of each extension 63 on its outer surface 65. Each tooth 55 is generally saw-tooth in shape and has a flat upper surface 57 that is substantially perpendicular to arm 53, and a hypotenuse surface 59. Note that the upper portion 67 of each extension 63 is substantially parallel to its adjacent arm 53, while the lower portion 69 of each extension 63 is inclined outward or away from its adjacent arm 53. A generally cylindrical knob 71 is located at the upper end of each extension 63 and is provided for improving the grip of a user during operation, as will be described below. The leading front edge of each extension 63 has a notched profile 73 (FIG. 14) for facilitating fit between bracket 33 and cartridge 31.

Figure 12:
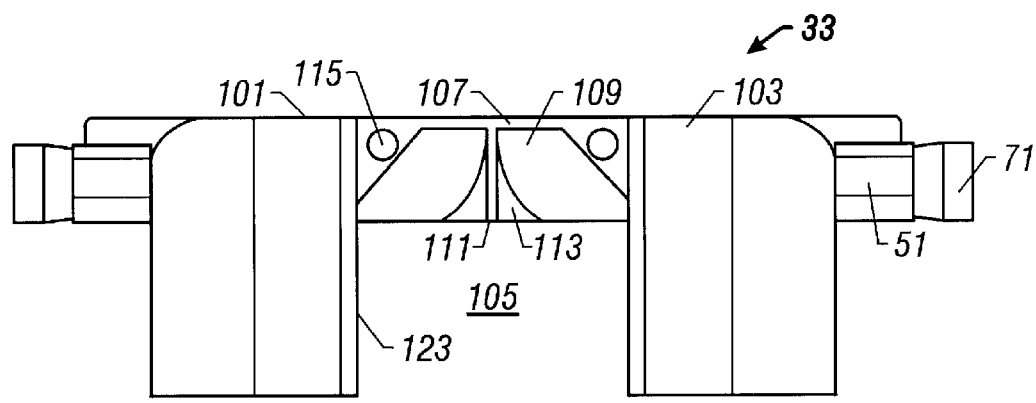
FIG. 12 is a top view of one side of the bracket of FIG. 1.
Figure 13:
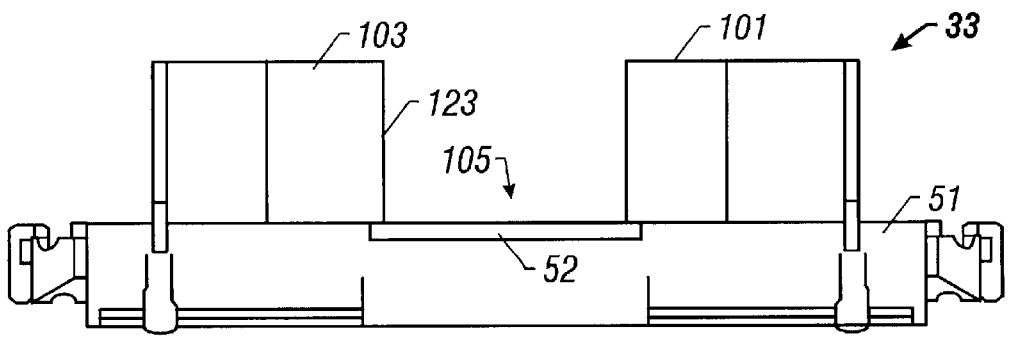
FIG. 13 is a bottom view of one side of the bracket of FIG. 1.
Figure 18:
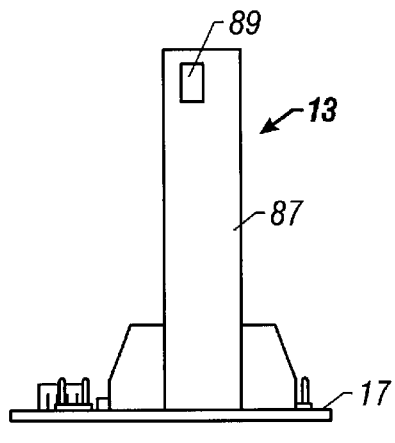
FIG. 18 is an outer side view of the retention mechanism of FIG. 1.
Figure 19:
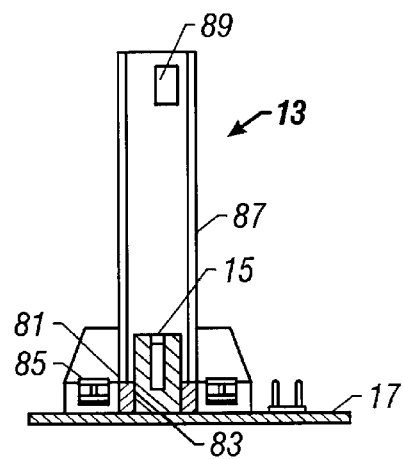
FIG. 19 is an inner side view of the retention mechanism of FIG. 1.

Again referring to FIGS. 10–15, bracket 33 also has a large, integrally formed, cooling fan mounting structure 101 on top of cross-bar 51. Structure 101 has two symmetrical side panels 103 that incline diagonally above the center of bracket 33. A central rectangular volume or opening 105 separates side panels 103 from each other. In FIGS. 10 and 11, opening 105 is defined between the generally C-shaped, rail fixtures or cross-sections 121 at the upper end of each panel 103. In FIGS. 12 and 13, opening 105 is defined between the transverse edges 123 extending from front to back on each panel 103. Although panels 103 are spaced apart by central rectangular opening 105, they are joined along their lower rear edges by an elongated end wall 107. End wall 107 has a concave inner surface 109 (FIGS. 10 and 12) that curves approximately 90 degrees from a vertical orientation to a horizontal orientation, moving from rear to front. Inner surface 109 is also bisected by a vertically oriented air baffle 111 having two concave surfaces 113. The upper end of baffle 111 extends to the upper end of end wall 107 which is the lower end of opening 105.

Figure 24:
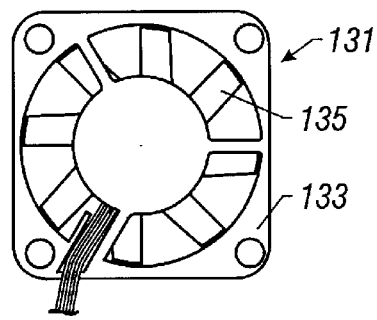
FIG. 24 is a plan view of a cooling fan for the bracket of FIGS. 11–15.

As shown in FIGS. 10–12, structure 101 also has a pair of hemispherical protrusions 115 that are raised above an upper plane of end wall 107 by a distance 117 (FIG. 11). Protrusions 115 extend into opening 105 and are provided for creating an interference and frictional fit between an axial cooling fan 131 (FIG. 24) and structure 101 that is free of fasteners. In the embodiment shown, fan 131 is a conventional, square box fan with a rectangular side profile that measures approximately 10×40 mm. Fan 131 has a frame 133 that centrally supports a motorized fan blade 135. Fan 131 snaps into the C-shaped cross-sections 121 of panels 103 and the opening 105 in structure 101 and is retained in place by protrusions 115. Thus, fan 131 is elevated above an upper surface of cross-bar 51 by a distance equal to a height of end wall 107 to allow airflow circulation between cartridge 31 and the cooling fan 131.

Referring now to FIGS. 16–19, retention mechanism 13 comprises an elongated, rectangular base 81 with a rectangular central opening 83 (FIG. 17) for accommodating socket 15. Base 81 is mounted to board 17 with a fastener 85 near each of its four corners. A pair of upright support posts 87 extend perpendicularly from the ends of base 81. When viewed from above (FIG. 17), posts 87 are generally U-shaped channel members of about the same length as extensions 63 of bracket 33. Each post 87 has a substantially rectangular hole 89 (FIGS. 18 and 19) in its side near its upper, forward corner. Holes 89 are located directly across from one another and are provided for accommodating teeth 55 on bracket 33.

Figure 5:
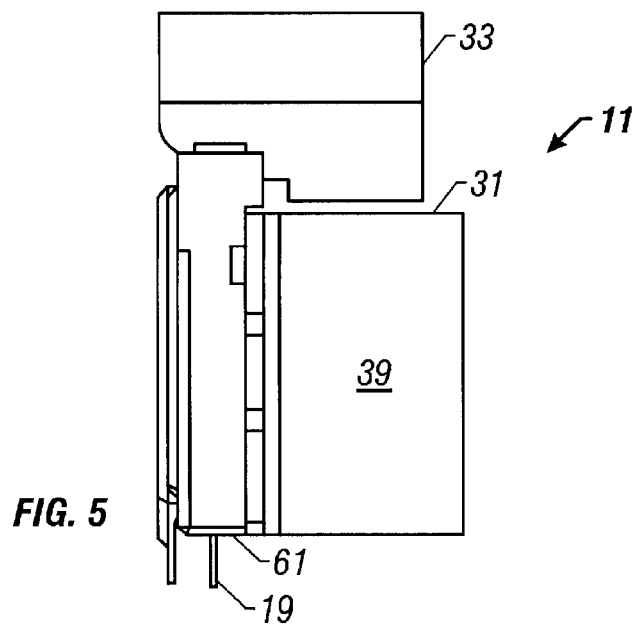
FIG. 5 is a side view of the cartridge/bracket assembly of FIG. 1.
Figure 6:
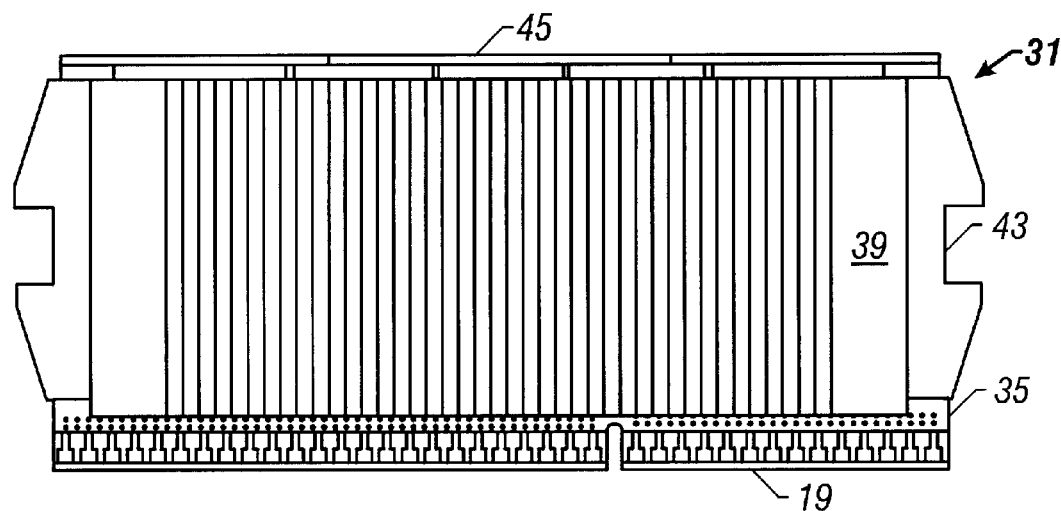
FIG. 6 is a front view of the cartridge of FIG. 1.
Figure 7:
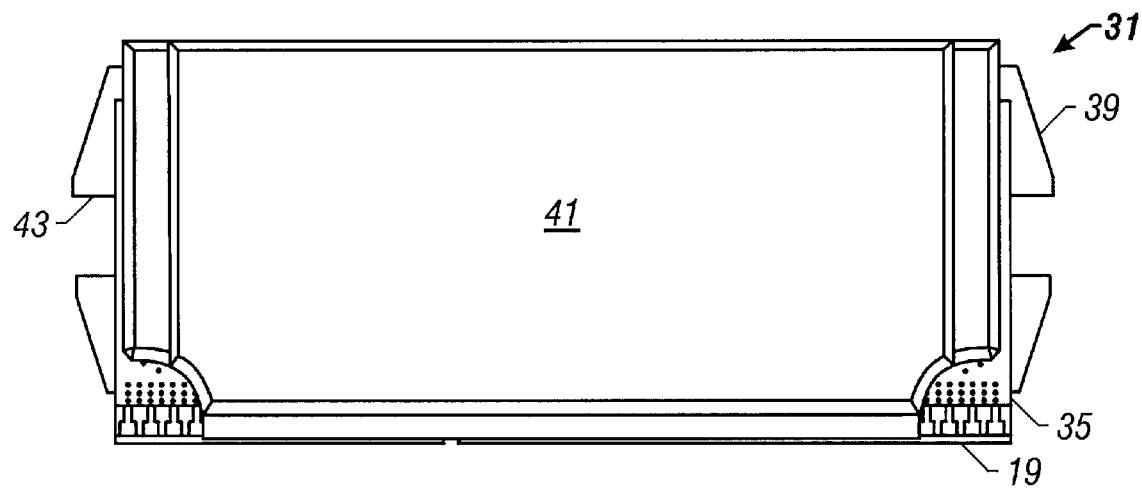
FIG. 7 is a rear view of the cartridge of FIG. 1.
Figure 8:
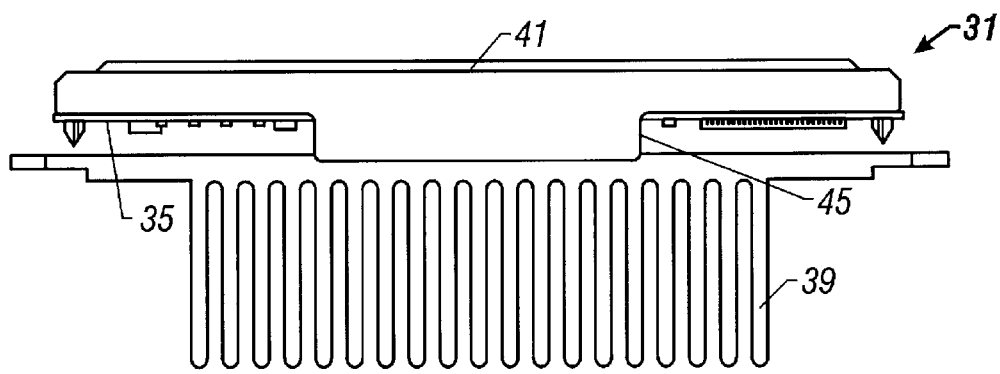
FIG. 8 is a top view of the cartridge of FIG. 1.
Figure 9:
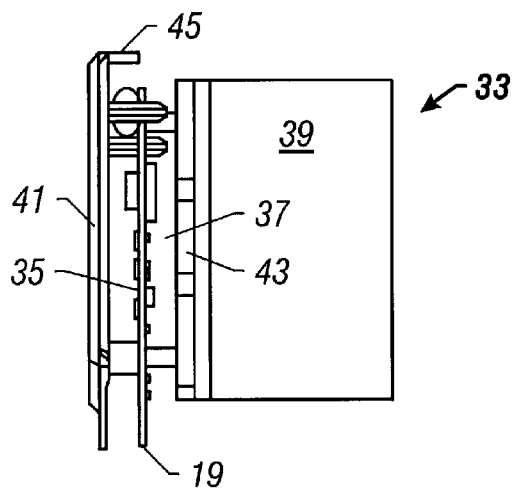
FIG. 9 is a side view of the cartridge of FIG. 1.

In operation, cartridge/bracket assembly 11 (FIGS. 2–5) is formed by securing bracket 33 to cartridge 31. This is done by flexing arms 53 slightly outward and sliding cartridge 31 (FIGS. 6–9) into the slots 54 in arms 53. When bracket 33 is properly installed on cartridge 31, fingers 52 on cross-bar 51 and profiles 73 on extensions 63 engage heatsink 39 to lock the components together in a snug but flexible fit. Edges 61 are substantially flush with the bottom edge of heatsink 39 (FIG. 5).

In the next step (FIG. 20), cartridge/bracket assembly 11 is installed in retention mechanism 13 by centering the lower end of assembly 11 between the upper ends of posts 87 and pushing assembly 11 downward therebetween as indicated by the arrows. The channel-like posts 87 are just wide enough to accept the width of assembly 11 between the front side of heatsink 39 and the rear sides of arms 53. The downward force applied to bracket 33 is transmitted to cartridge 31.

Figure 20:
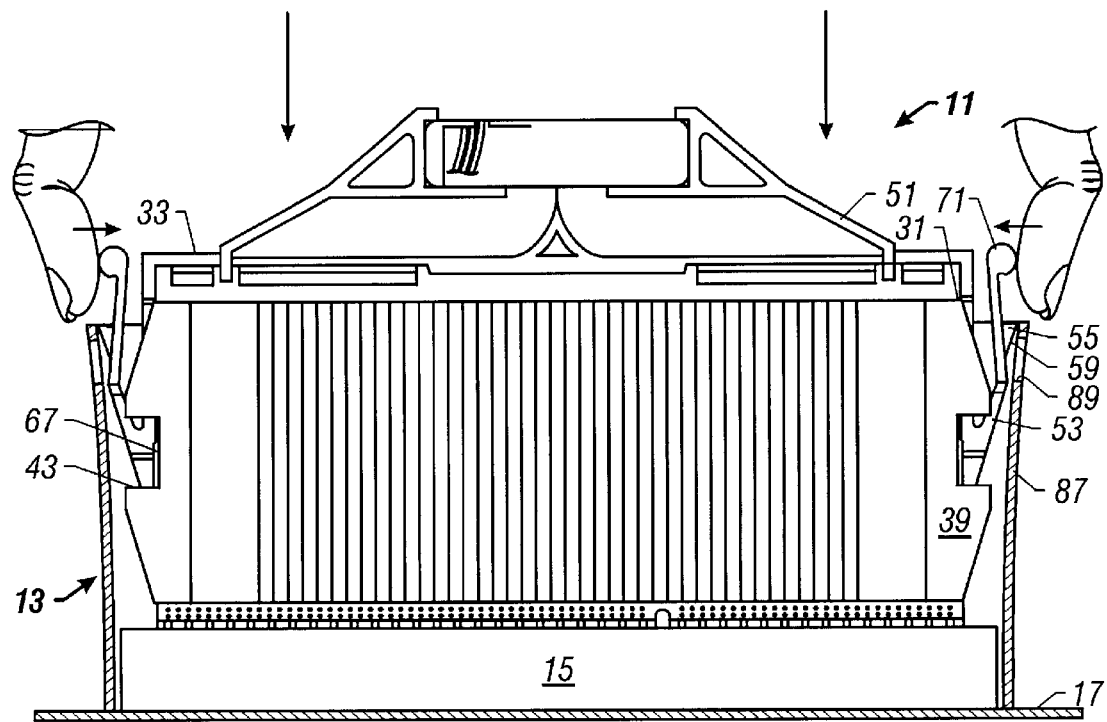
FIG. 20 is a front sectional view of the assembly of FIG. 1 at an initial stage of insertion into the retention mechanism.
Figure 21:
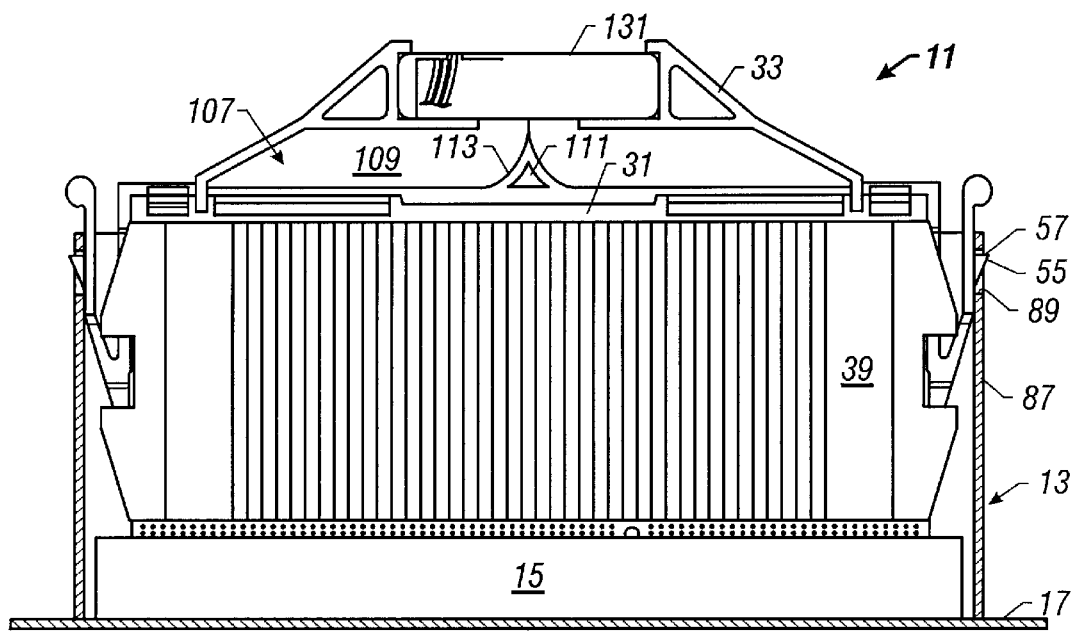
FIG. 21 is a front sectional view of the assembly of FIG. 1 fully seated in the retention mechanism.

As teeth 55 on the outer surfaces of bracket 33 engage the inner surfaces of posts 87, the hypotenuse surfaces 59 of teeth 55 force posts 87 to pivot outward slightly about their bases (FIG. 20). Retention mechanism 13 is formed from such materials and secured to board 17 in a such a manner that a limited amount of play or movement is permissible. Posts 87 are flexed outward as assembly 11 descends and teeth 55 slide along the inner surfaces of posts 87. When teeth 55 engage holes 89 in posts 87, posts 87 snap back to their upright positions (FIG. 21) against the outer surfaces of arms 53. At this stage, card connector edge 19 is fully seated in socket 15 and assembly 11 is prevented from upward movement since the flat upper surfaces 57 of teeth 55 are locked in abutment with holes 89.

With assembly 11 installed in retention mechanism 13, fan 131 is located directly adjacent to cartridge 31 (FIG. 1). Note that the fins of heatsink 39 are parallel to the direction of the airflow delivered by fan 131. The concave surfaces 109, 113 of end wall 107 and air baffle 111, respectively (FIGS. 10 and 12), help direct airflow all along the frontal length of heatsink 39 and all of its fins, thereby maximizing the cooling capability of fan 131.

Figure 22:
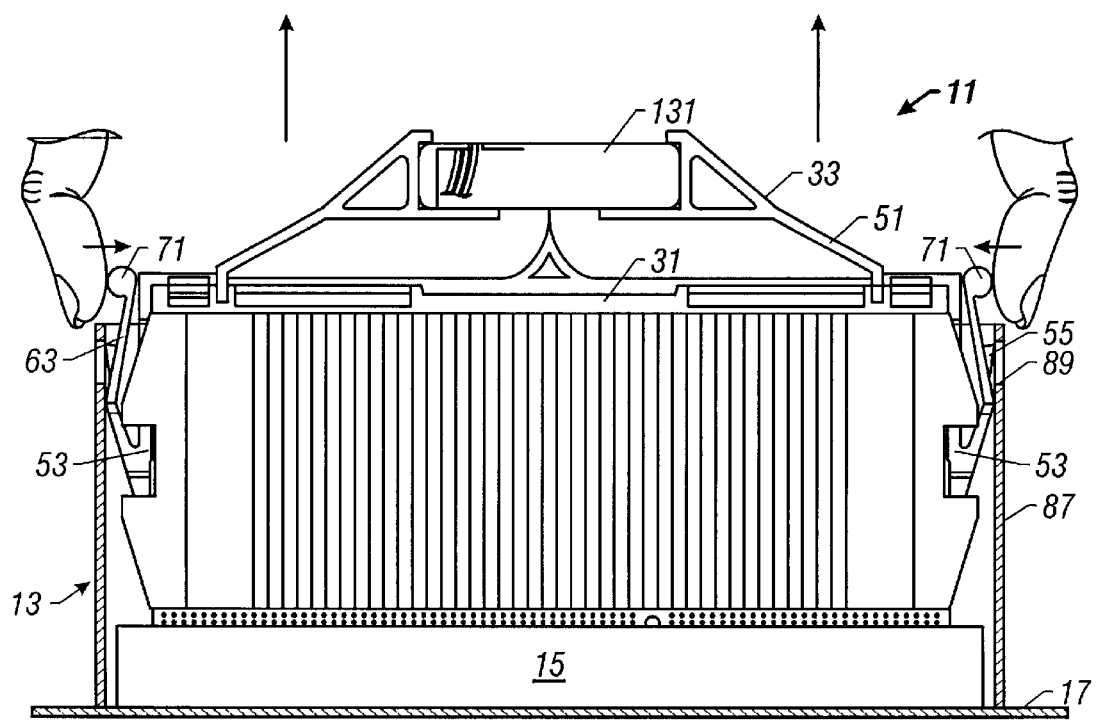
FIG. 22 is a front sectional view of the assembly of FIG. 1 at an initial stage of removal from the retention mechanism.
Figure 23:
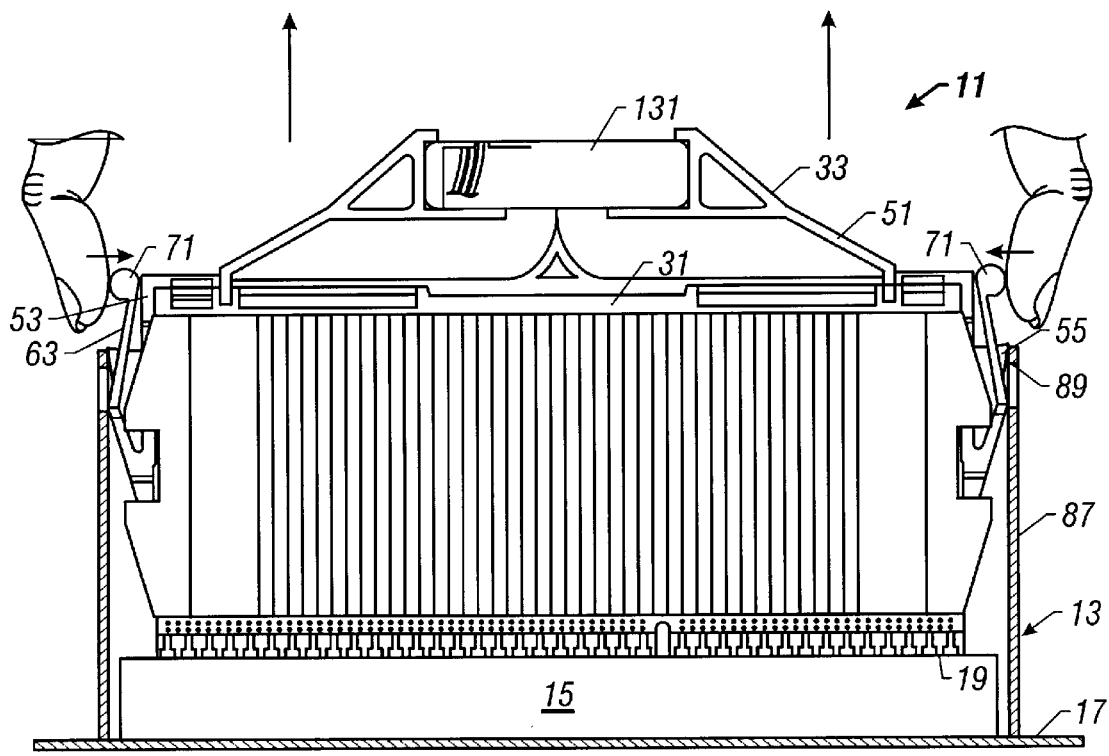
FIG. 23 is a front sectional view of the assembly of FIG. 1 at an intermediate stage of removal from the retention mechanism.

As shown in FIG. 22, assembly 11 is removed from retention mechanism 13 by pushing or pinching knobs 71 inward as shown by the arrows. The flexible but resilient plastic of bracket 33 allows it to elastically flex in such as manner that extensions 63 are flexed or pivoted inward relative to edges 61 while arms 53 remain in contact with cartridge 31. This motion allows teeth 55 to retract away from and out of interference with holes 89. Note that the upward force required to disengage bracket 33 from retention mechanism 13 (FIG. 23) is much less than the frictional force holding connector edge 19 in socket 15. Thus, extensions 63 are easily pinned in against arms 53 while additional upward force is exerted on assembly 11. The upward force on assembly pulls edge 19 out of socket 15 so that assembly 11 is completely removed from retention mechanism 13.

Alternatively, the retention mechanism 13 may be mounted directly to the chassis. In this latter version, one sheet metal tab (not shown) on each side of the CPU is turned up at 90 degrees such that the processor is assembled via a card edge connector in the same plane as the base planar, thereby engaging the two sheet metal tabs located external to the base planar card. The removal of this assembly is done consistently with the method described previously.

The invention has several advantages. The bracket shown and described here functions as an integrated fan holder, air baffle, and processor retainer. The bracket uses single-piece construction with contoured lead-ins for tight space insertion of both the mechanism itself into a retention mechanism, and the cooling fan into the bracket.

The bracket also works with industry standard 10×40 mm fans. The fan snaps into place for easy assembly, and is held in place with snap-type features on the locating and mounting bracket. The snap geometry minimizes harmful fan vibration while retaining both the fan and the processor cartridge during shock forces of about 30 g's. In addition, the fan is perpendicular to the CPU die plane for maximum cooling efficiency. This simple, inexpensive bracket also allows technicians to easily install, remove, replace, and/or upgrade electrical components with ease. The bracket is compatible with both existing cartridges and retention mechanisms, as well as with newer designs. The efficient, reliable design requires no fasteners such as screws for mounting.

While the invention has been shown or described in only some of its forms, it should be apparent to those skilled in the art that it is not so limited, but is susceptible to various changes without departing from the scope of the invention.

What is claimed is:

1. A bracket assembly for integrating the cooling and handling of a processor cartridge relative to a retention mechanism, the bracket comprising:

a body having a pair of arms that are adapted to releasably engage a processor cartridge and be detachably coupled to a retention mechanism for electrically interconnecting the processor cartridge to the retention mechanism;

a fan mounting structure integrally formed on the body and having a fixture with a pair of panels with C-shaped cross-sections, the fixture being spaced apart from the body to allow airflow therebetween;

a cooling fan removably mounted in the fixture of the fan mounting structure and adapted to cool the processor cartridge; and a protrusion on the fan mounting structure extending into the fixture for creating a frictional fit between the cooling fan and the fan mounting structure that is free of fasteners for retaining the cooling fan therein; and wherein the bracket is adapted to form an assembly with the processor cartridge that is removably mounted to the retention mechanism.

2. A bracket assembly for integrating the cooling and handling of a processor cartridge relative to a retention mechanism, the bracket comprising:

a body having a pair of arms that are adapted to releasably engage a processor cartridge and be detachably coupled to a retention mechanism for electrically interconnecting the processor cartridge to the retention mechanism;

a fan mounting structure integrally formed on the body and having an air baffle and a fixture that is spaced apart from the body to allow airflow therebetween;

a cooling fan removably mounted in the fixture of the fan mounting structure and adapted to cool the processor cartridge, wherein the fan mounting structure and the air baffle have concave surfaces for directing airflow of the cooling fan;

a protrusion on the fan mounting structure extending into the fixture for creating a frictional fit between the cooling fan and the fan mounting structure that is free of fasteners for retaining the cooling fan therein; and wherein the bracket is adapted to form an assembly with the processor cartridge that is removably mounted to the retention mechanism.

3. A bracket assembly for integrating both the cooling and handling of a processor cartridge relative to a retention mechanism, the bracket comprising:

a body having a pair of arms that to releasably engage a processor cartridge and are detachably coupled to a retention mechanism for electrically interconnecting the processor cartridge to the retention mechanism;

a fan mounting structure integrally formed on the body and having a fixture that is spaced apart from the body to allow airflow therebetween;

a cooling fan removably mounted in the fixture of the fan mounting structure and adapted to cool the processor cartridge; and a protrusion on the fan mounting structure extending into the fixture creating a frictional fit between the cooling fan and the fan mounting structure that is free of fasteners for retaining the cooling fan therein; and wherein the bracket is adapted to form an assembly with the processor cartridge that is removably mounted to the retention mechanism.

4. The bracket assembly of claim 3 wherein the fan mounting structure contains an air baffle for directing airflow of the cooling fan.

5. The bracket assembly of claim 3 wherein the assembly is adapted to be removed from the retention mechanism by flexing a portion of the arms inward relative to the body and lifting the assembly out of the retention mechanism.

6. The bracket assembly of claim 3 wherein the body, arms, and fan mounting structure are integrally formed as a single unit from elastic, resilient plastic.

7. The bracket assembly of claim 3 wherein the arms are substantially perpendicular to the body.

* * * * *